United States Patent
Sezi et al.

[11] Patent Number: 6,153,350
[45] Date of Patent: Nov. 28, 2000

[54] POLYBENZOXAZOLE AND POLYBENZOTHIAZOLE PRECURSORS

[75] Inventors: Recai Sezi, Röttenbach; Michael Keitmann, Weisendorf; Günther Schmid, Erlangen, all of Germany

[73] Assignee: Siemens Aktiengesellschaft, Munich, Germany

[21] Appl. No.: 09/161,148

[22] Filed: Sep. 25, 1998

[30] Foreign Application Priority Data

Sep. 24, 1997 [DE] Germany .............. 197 42 132

[51] Int. Cl.[7] .............. G03C 1/52; C08G 69/00
[52] U.S. Cl. .......... 430/192; 430/146; 430/149; 528/327; 528/360; 528/367; 528/373
[58] Field of Search ................... 430/146, 149, 430/192; 528/327, 360, 367, 373

[56] References Cited

U.S. PATENT DOCUMENTS

| | | | |
|---|---|---|---|
| 4,339,521 | 7/1982 | Ahne et al. | 430/192 |
| 4,849,051 | 7/1989 | Ahne et al. | 156/659.1 |
| 4,965,134 | 10/1990 | Ahne et al. | 428/411.1 |
| 5,011,753 | 4/1991 | Mueller et al. | 430/4 |
| 5,037,720 | 8/1991 | Khanna | 430/190 |
| 5,077,378 | 12/1991 | Mueller et al. | 528/185 |
| 5,194,562 | 3/1993 | Inbasekaran et al. | 528/125 |

FOREIGN PATENT DOCUMENTS

| | | |
|---|---|---|
| 0023662 | 5/1983 | European Pat. Off. |
| 0264678 | 9/1991 | European Pat. Off. |
| 0291778 | 3/1994 | European Pat. Off. |
| 0291779 | 7/1994 | European Pat. Off. |
| 2 000 601 | 9/1969 | France |
| 1 811 588 AC3 | 1/1973 | Germany |
| 3716629 | 6/1997 | Germany |

OTHER PUBLICATIONS

"Polymers in Microeletronics—Fundamentals and Applications", Soane et al., Elsevier Science Publishers B.V., Amsterdam, 1989, pp. 189–191.

*Primary Examiner*—Janet Baxter
*Assistant Examiner*—Barbara Gilmore
*Attorney, Agent, or Firm*—Herbert L. Lerner; Laurence A. Greenberg

[57] ABSTRACT

The polybenzoxazole and polybenzothiazole precursors of the invention have the following partial structure:

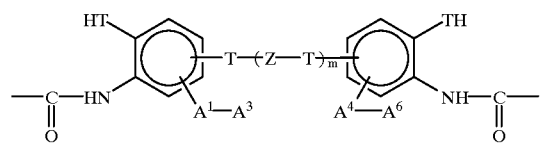

where:

$A^1$ to $A^6$ are—independently of one another—H, F, $CH_3$, $CF_3$, $OCH_3$, $OCF_3$, $CH_2CH_3$, $CF_2CF_3$, $OCH_2CH_3$ or $OCF_3CF_3$;

T is O or S, and m is 1;

Z is a carbocyclic or heterocyclic aromatic radical.

16 Claims, No Drawings

POLYBENZOXAZOLE AND POLYBENZOTHIAZOLE PRECURSORS

BACKGROUND OF THE INVENTION

FIELD OF THE INVENTION

The invention relates to novel polybenzoxazole and polybenzothiazole precursors and to resist solutions containing these precursors.

Throughout the specification and claims, the parenthetical expression (thio) is used as a convenient abbreviation to denote independently at each occurrence the alternative presence of oxygen or sulfur in hydroxyl, mercaptan, ether and thioether groups, as in poly[bis(phenolcarboxamide)-ether] and poly[bis(thiophenolcarboxamide)-thioether] precursors for polybenzoxazoles and polybenzothiazoles respectively.

In microelectronics, highly heat-resistant polymers are needed as protection and insulation layers. Such polymers can be employed as dielectric between two metal planes, for example in multi chip modules and memory and logic chips, or as buffer coat between the chip and its housing. Some of these polymers, for example precursors of aromatic polyimides (PIs) and polybenzoxazoles (PBOs), have good solubility in organic solvents and good film-forming properties and can be applied to the electronic components by inexpensive spin-coating methods. The precursors are then cyclized, i.e. converted into the corresponding polymer, by heat treatment, and thus obtain their final properties.

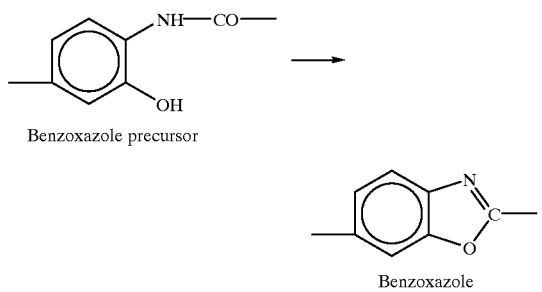

Benzoxazole precursor

Benzoxazole

The cyclization is accompanied by disappearance of the polar, hydrophilic groups of the PBO precursor (OH, NH and CO), which would otherwise adversely affect the dielectric properties and water absorption. This is, for example, an essential advantage of polybenzoxazoles over polyimides and in particular over hydroxypolyimides. However, the cyclization is not important just for good dielectric properties and low water absorption of the end product, but also for its high heat stability.

The demands made of the cyclized final product are very high. For example, besides the lowest possible dielectric constant and high thermal stability, a particular requirement is for low moisture absorption. This is because absorbed moisture impairs not only the electrical properties, but can also promote corrosion of the metallic conductor tracks or result in bubble formation and flaking at high temperatures.

Polyimides and polybenzoxazoles have the following advantages over many other high-temperature-stable polymers:

In contrast to the cyclized end product, they can be applied to a substrate as a soluble precursor and then cyclized, during which the solubility and thus the sensitivity to solvents and other process chemicals decreases greatly. For this reason, the processing of, for example, precyclized polybenzoxazoles is difficult.

The addition of suitable photo-active components to the precursors allows the preparation of photo-sensitive compositions, enabling inexpensive, direct structuring of the dielectric. Polybenzoxazoles have the further advantage over polyimides of being structurable in positive mode and developable in aqueous-alkaline media (see EP 0 023 662 B1 corresponding to U.S. Pat. No. 4,395,482, EP 0 264 678 B1 and EP 0 291779 B1). To this end, the PBO precursors used must be soluble in alkaline developers, preferably ones which are free from metal ions.

Benzocyclobutene (BCB), which can be processed in a similar way and structured negatively, has a significantly lower heat stability than polyimide and polybenzoxazole.

A further, important requirement in connection with inexpensive production of microelectronic components is the planarization capacity of the dielectric. The reason for this is that, during the production of such components, level differences occur during application of various layers, making further processing, for example lithographic production of fine structures, more difficult. By contrast, a planarized substrate allows photo-lithographic processes to be carried out with better dimensional accuracy and greater process tolerances. The use of a dielectric which allows good planarization enables expensive polishing procedures (chemical mechanical polishing, CMP) to be avoided in the production of the components.

Alkali-soluble PBO precursors which are suitable for the preparation of photo-sensitive compositions are disclosed, for example, in EP 0 023 662 B1, EP 0 264 678 B1, EP 0 291 779 B1 and DE 37 16 629 C2; these precursors can be cyclized on the substrate (in this respect, see EP 0 291778 B1). However, the known polymers exhibit relatively high moisture absorption, for example 1.7% (see EP 0 291778 B1), after cyclization (conversion into the polybenzoxazole). There is no mention of the planarization capacity of the polymers prepared.

SUMMARY OF THE INVENTION

According to this invention, there are provided poly[bis(thio)phenolcarboxamide(thio)ether] polybenzoxazole and polybenzothiazole precursors which are readily soluble in both organic solvents and in aqueous-alkaline developers which are free from metal ions, are highly suitable for photosensitive compositions and can be processed by spin-coating methods. These precursors are easy to cyclize on substrates and, after cyclization, have, in particular, very low moisture absorption of 1% by weight or even less, and a high degree of planarization, in addition to high heat stability.

The poly[bis(thio)phenolcarboxamide-(thio)ether] polybenzoxazole and polybenzothiazole precursors of this invention contain the following partial structure:

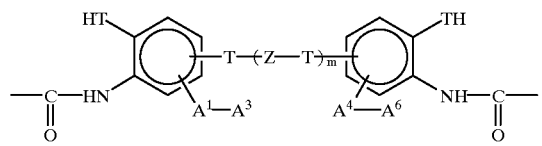

where:

$A^1$ to $A^6$ are—independently of one another—H, F, $CH_3$, $CF_3$, $OCH_3$, $OCF_3$, $CH_2CH_3$, $CF_2CF_3$, $OCH_2CH_3$ or $OCF_2CF_3$;

T is O or S, and m is 0 or 1;

Z is one of the following carbocyclic or heterocyclic aromatic radicals:

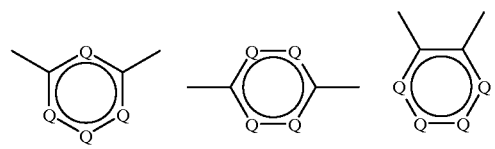
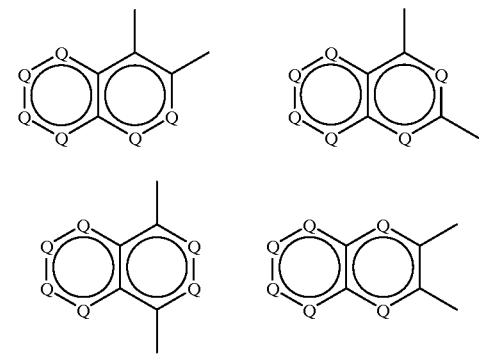
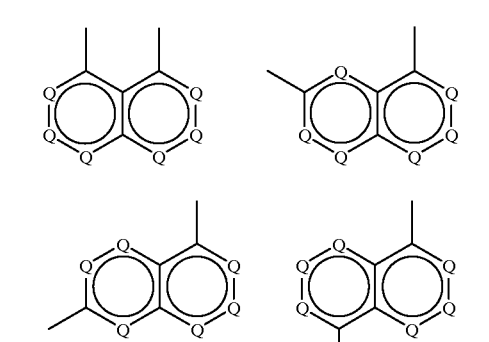
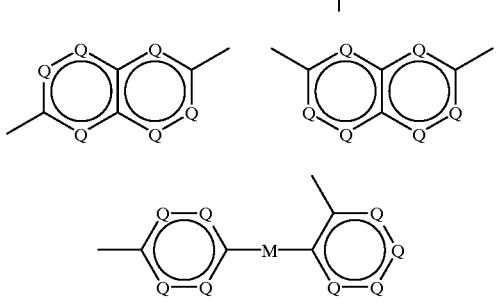
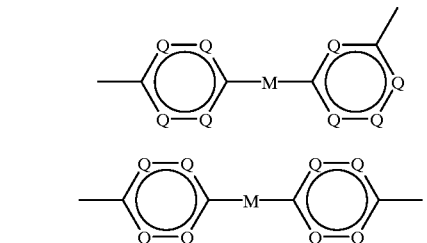
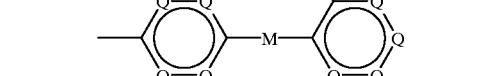
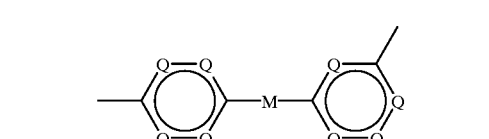
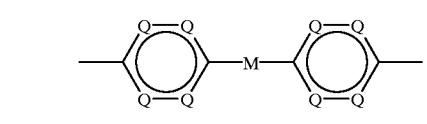
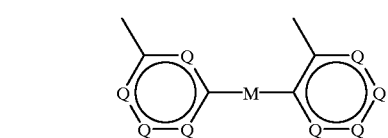

-continued

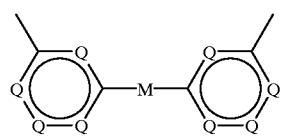
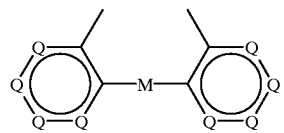
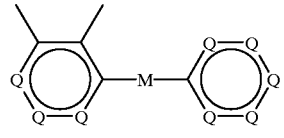
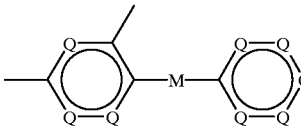
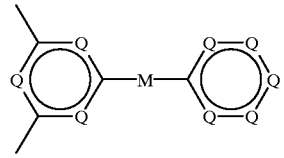
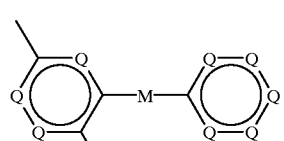
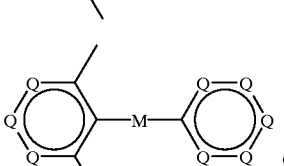 or
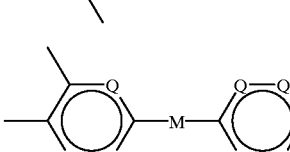

where Q=C—A or N, where A=H, F, $(CH_2)_pCH_3$, $(CF_2)_pCF_3$, $O(CH_2)_pCH_3$, $O(CF_2)_pCF_3$, $CO(CH_2)_pCH_3$, $CO(CF_2)_pCF_3$ where p=0 to 8 (linear or branched chain), $OC(CH_3)_3$, $OC(CF_3)_3$, $C_6H_5$, $C_6F_5$, $OC_6H_5$, $OC_6F_5$, cyclopentyl, perfluorocyclopentyl, cyclohexyl or perfluorocyclohexyl, where, in the isolated aromatic rings, a maximum of 3 N-atoms may be present per ring and only 2 N-atoms may be adjacent, and, in the fused ring systems, a maximum of 2 N-atoms may be present per ring, M=a single bond, $(CH_2)_n$, $(CF_2)_n$, $CH(CH_3)$, $CH(CF_3)$, $CF(CH_3)$, $CF(CF_3)$, $C(CH_3)_2$, $C(CF_3)_2$, $CH(C_6H_5)$, $CH(C_6F_5)$, $CF(C_6H_5)$, $CF(C_6F_5)$, $C(CH_3)(C_6H_5)$, $C\{CH_3\}\{C_6F_5\}$ $C(CF_3)(C_6H_5)$ $C\{CF_3\}$, $(C_6H_5)$, $(C_6H_5)_2$, $C(C_6F_5)_2$, CO, $SO_2$,

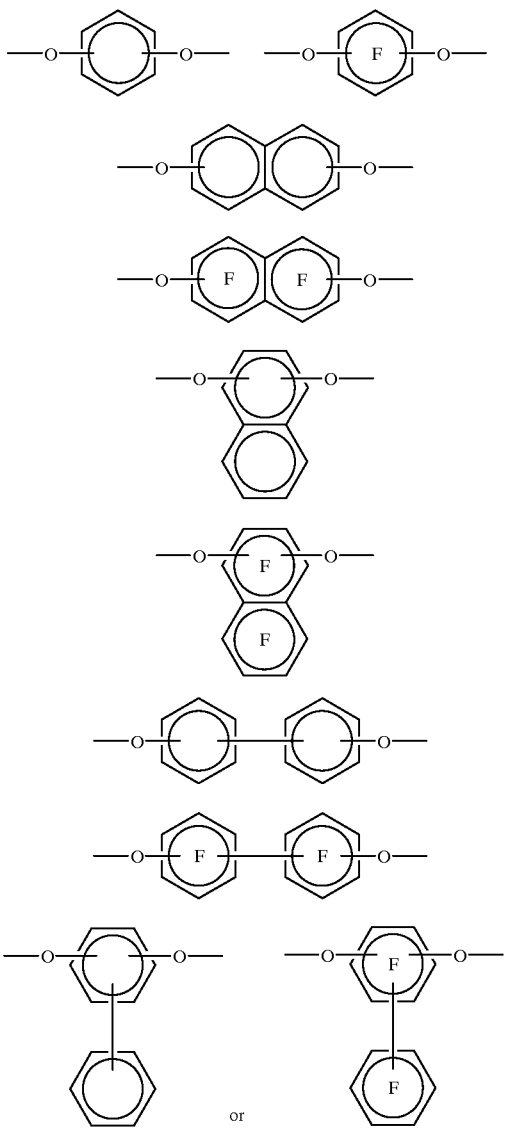

with the proviso that, when Z=phenylene (these are the first three of the radicals where Q=C—A which are listed above under Z) or m=0, at least one of the radicals $A^1$ to $A^6$ must be other than H, and when

Z=

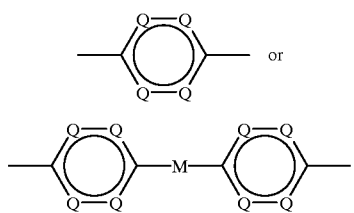

where Q is C—F and M is a single bond, the NH—CO groups of the polybenzoxazole precursor partial structure must be in the o- or p-position to the O bridge.

In the poly[bis(thio)phenolcarboxamide-(thio)ether] precursor for polybenzoxazoles and polybenzothiazoles according to the invention, the above partial structure is linked to the residue having one to thirty carbon atoms and up to three aromatic rings of at least one dicarboxylic acid. The precursor includes from 2 to 10.000 partial structures and dicarboxylic acid residues, a number within this range resulting in a weight average molecular weight ranging preferably from 5.000 to 100.000.

Poly[bis(thio)phenolcarboxamide-(thio)ether] polymer precursors of the structure indicated above are prepared by reacting one or more corresponding bis-o-aminophenols or bis-o-aminothiophenols with approximately stoichiometric quantities of one or more suitable dicarboxylic acids or dicarboxylic acid derivatives, in particular active esters and chlorides. The bis-o-aminophenol or bis-o-aminothiophenol and the dicarboxylic acid or dicarboxylic acid derivative are reacted in an organic solvent at a temperature of from −20 to 150° C., and the polymer is then precipitated by adding the reaction solution drop wise to a suitable precipitant. Depending on the relative proportions of bis-o-amino(thio)phenol and dicarboxylic acid reactants the resulting polymer is terminated with carboxyl groups, o-amino(thio)phenol groups, or some of each. The precipitated polymer is already ready for use after filtration and drying. Before the precipitation of the polymer, amino end groups when present can be masked, i.e. blocked, using a dicarboxylic anhydride.

The poly[bis(thio)phenolcarboxamide-(thio)ether] polymer precursors of the invention are readily soluble in many organic solvents, such as acetone, cyclohexanone, diethylene glycol monoethyl or diethyl ether, N-methylpyrrolidone, γ-butyrolactone, ethyl lactate, tetrahydrofuran and ethyl acetate, and in aqueous-alkaline developers which are free from metal ions, and can easily be processed by spin-coating methods. After cyclization on the substrate, the resultant polybenzoxazoles and polybenzothiazoles have very low moisture absorption, a high degree of planarization and high heat stability.

The poly[bis(thio)phenolcarboxamide-(thio)ether] precursors of the invention are compatible with diazoketones and are therefore advantageously suitable for photoresist solutions containing—dissolved in a solvent—a polybenzoxazole or polybenzothiazole precursor and a diazoketone-based photo-active component. Such photo-active compositions surprisingly exhibit high resolution and very good film quality. In the photo-resist solutions, the weight ratio between polybenzoxazole or polybenzothiazole precursor and diazoquinone is advantageously between 1:20 and 20:1, preferably between 1:10 and 10:1.

DESCRIPTION OF PREFERRED EMBODIMENTS

The bis-o-aminophenols and bis-o-aminothiophenols employed for the preparation of the poly[bis(thio)phenolcarboxamide-(thio) ether] polybenzoxazole and polybenzothiazole precursors of the invention have the following structure:

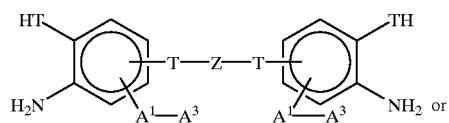

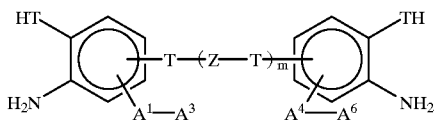

in which $A^1$ through $A^6$, T, Z, and m are as defined above.

These bis-o-aminophenols and bis-o-aminothiophenols are the subject-matter of the following simultaneously filed German patent applications:

No.197 42 195.4—"Bis-o-amino(thio)-phenols, and their preparation" (GR 97 P 3688);

No. 197 42 196.2—"Bis-o-amino(thio)-phenols, and their preparation" (GR 97 P 3684).

Furthermore, the characterizations "$^1A^1$–$A^3$" and "$A^4$–$A^6$" in the structural formulae mean that the aminophenyl groups contain radicals $A^1$, $A^2$ and $A^3$, and $A^4$, $A^5$ and $A^6$ respectively.

Preferred are such bis-o-aminophenols and bis-o-aminothiophenols and the resulting poly[bis(thio)phenolcarboxamide-(thio)ether] precursors for polybenzoxazoles and polybenzothiazoles in which, in the partial structure defined above, each Q is C—H or C—F.

Also preferred are such bis-o-aminophenols and bis-o-aminothiophenols and the resulting poly[bis(thio)phenolcarboxamide-(thio)ether] precursors for polybenzoxazoles and polybenzothiazoles in which, in the partial structure defined above, from zero to two Q are N.

Particularly preferred are such bis-o-aminophenols and the resulting poly[bis(phenolcarboxamide)-ether] precursors for polybenzoxazoles in which, in the partial structure defined above T=O and m=1, and especially such bis-o-aminophenols and resulting precursors for polybenzoxazoles in which Z is

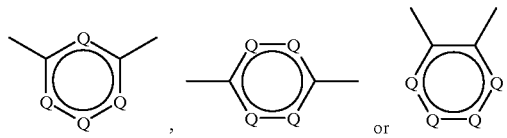

in which from zero to three Q are N not adjacent to one another and the remaining Q are C—H, C—F, or C—F$_3$, in which Z is

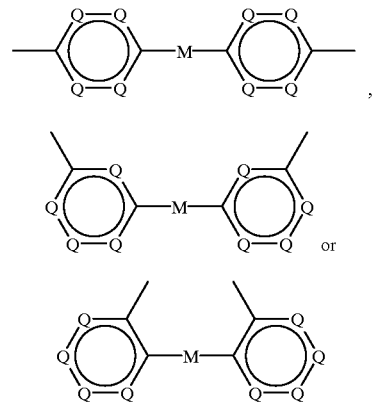

or in which Q is C—H or C—F and M is a single bond, C(CF$_3$)$_2$ or CO.

Examples of such bis-o-aminophenols are the following:

4,4'-bis (4-amino-3-hydroxyphenoxy) octafluorobiphenyl

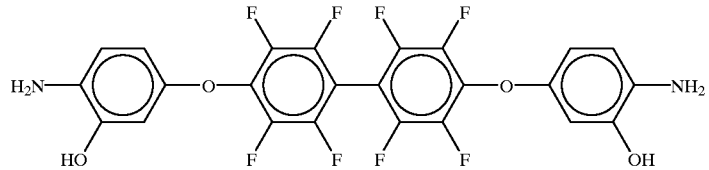

4,4'-bis (4-amino-3-hydroxyphenoxy) octafluorobenzophenone

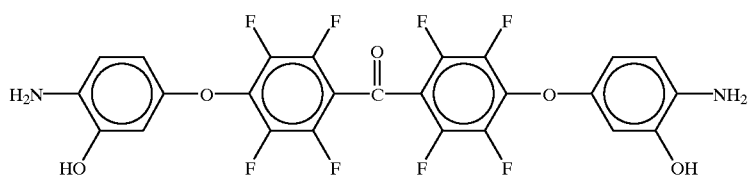

2,4-bis (4-amino-3-hydroxyphenoxy) trifluoropyridine

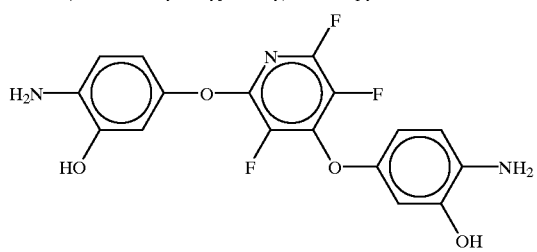

-continued 2,4-bis (4-amino-3-hydroxyphenoxy)-1-trifluoromethyl-3,5,6-trifluorobenzene

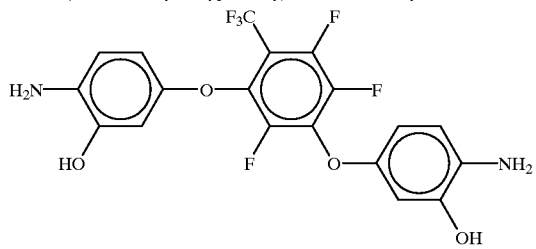

2,2-bis [4-(-amino-3-hydroxy-2,5,6-trifluorophenoxy)-phenyl] hexafluoropropane

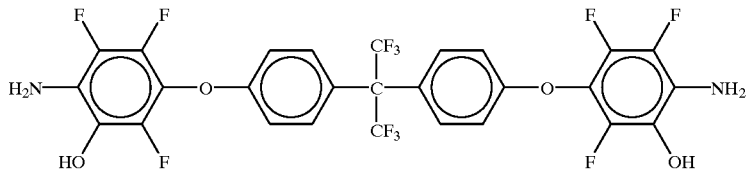

1,4-bis (4-amino-3-hydroxy-2,5,6-trifluorophenoxy) tetrafluorobenzene

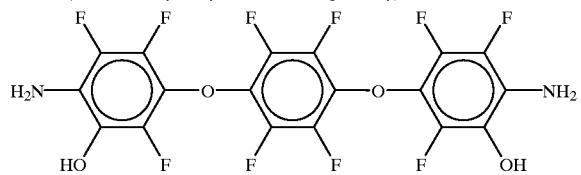

4,6-bis (4-amino-3-hydroxy-2,5,6-trifluorophenoxy) pyrimidine

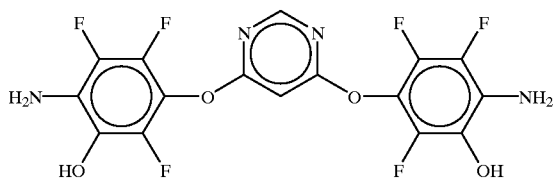

4,4'-bis (4-amino-3-hydroxy-2,5,6-trifluorophenoxy) octafluorobiphenyl

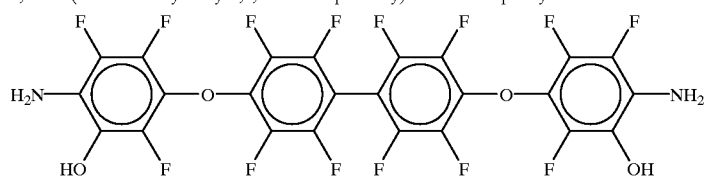

For the preparation of the poly[bis(thio)phenolcarboxamide-(thio)ether] precursors, aromatic and non-aromatic dicarboxylic acids, such as 4,4'-oxybisbenzoic acid, 2,2-bis-(4-carboxyphenyl)perfluoropropane, adipic acid, azelaic acid, perfluoroisophthalic acid, 1,3-bis(3-carboxypropyl)tetramethyldisiloxane and isophthalic acid, are particularly suitable. In principle, however, all dicarboxylic acids which have 1 to 30 carbon atoms linking the carboxyl groups and/or up to three aromatic rings can be used. If dicarboxylic acid chlorides are used in the polymerization, the use of a basic acid scavenger is advantageous. Preferred basic acid scavengers are pyridine, triethylamine, diazabicyclooctane and polyvinylpyridine. However, it is also possible to use other basic acid scavengers, particular preference being given to those which are readily soluble in the solvent used for the synthesis, for example N-methylpyrrolidone, and in water or water/alcohol mixtures (precipitant) and also those which are totally insoluble in the solvent, for example cross-linked polyvinylpyridine. In place of dicarboxylic acid chlorides in the polymerization there can be used active esters such as dicarboxylic acid phenyl esters, or free dicarboxylic acids in conjunction with a non-acidic water reactive condensing agent such as N,N'-dicyclohexylcarbodiimide or carbonyldiimidazole.

Particularly suitable solvents for the poly[bis(thio)phenolcarboxamide-(thio)ether] precursor synthesis are dimethylacetamide, γ-butyrolactone and N-methylpyrrolidone. In principle, however, any solvent in which the starting components are readily soluble can be used. Particularly suitable precipitants are water and mixtures of water with various alcohols, for example ethanol and isopropanol.

Cyclization of the poly[bis(thio)phenolcarboxamide-(thio)ether] polybenzoxazole and polybenzothiazole precursors of this invention to moisture- and high temperature stable polybenzoxazoles and polybenzothiazoles is effected by heat tempering the precursors at 300–400° C. for 10 minutes to 24 hours, preferably at 325–375° C. for 0.5 to 4 hours.

Photoresist solutions according to this invention are obtained by combining a solution of a poly[bis(thio)

phenolcarboxamide-(thio)ether] polybenzoxazole or polybenzothiazole precursor of this invention in an organic solvent with a photo-active diazoketone component and optionally an adhesion promoter. Effective diazoquinones (o-benzoquinone and o-naphthoquinone diazides) are known and described, for example in U.S. Pat. Nos. 2,767,092, 2,772,972, 2,797,213, 3,046,118, 3,106,465, 3,148,983, 3,669,658 and 4,395,482. Particularly preferred are diazoquinones that are insoluble in aqueous alkalies, that is having strongly hydrophobic properties, and become very soluble after exposure to light in aqueous alkaline developer solution. Particularly preferred diazoquinones with these properties include for example N-dehydroabietyl-6-diazo-5 (6)-oxo-1-naphthalenesulfonamide, 2,2-bis(4-hydroxyphenylpropane) diester of naphthoquinone [1.2] diazo-(2)-5-sulfonic acid, n-dehydroabietyl-3-diazo-4(3)-oxo-1-naphthalenesulfonamide, N-dehydroabietyl-[5.6.7.8]-tetrahydro-4-diazo-(3(4)-oxo-2-napthalenesulfonamide, and N-dextropimaryl-3-diazo-4-oxo[1.5]-cyclohexadiene-1-sulfonamide.

Effective diazoquinones that can be used also include the 1,2-diazonaphthoquinone-4-sulfonic acid and 1,2-diazonapththoquinone-5-sulfonic acid esters of various phenols described in Proc. SPIE 1466 (1991) pages 106–116, which disclosure is here incorporated by reference.

Suitable adhesion promoters include, for example, polyamidocarboxylic acids, such as condensation products of an aromatic tetracarboxylic acid dianhydride with a diaminosiloxane. Such an adhesion promoter condensation product can have the structure

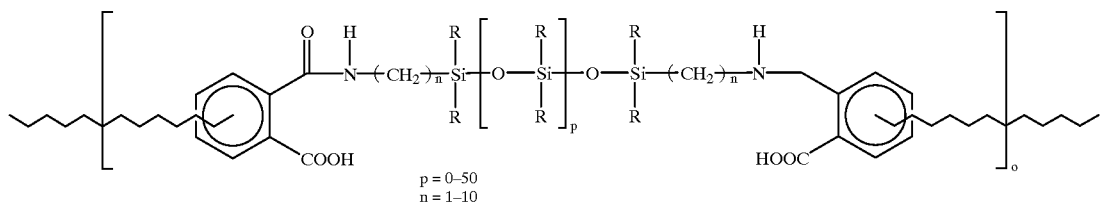

Heat stable and moisture-resistant structures are obtained by coating a photo-resist solution according to this invention on a substrate, exposing to actinic light, electron beam or ion beam through a mask and extracting the solubilized portions resulting from the exposure. Preferred substrates include glass, metal, plastic, or semiconductor material, especially silicon wafers.

Further details of known techniques and materials for preparing resist structures are found in U.S. Pat. No. 4,395,482 at column 5 line 15 to column 6 line 57, which disclosure is here incorporated by reference.

The invention will be illustrated in greater detail below with reference to working examples.

EXAMPLE 1
Preparation of a bis-o-aminophenol: 4,4'-bis(4-amino-3-hydroxyphenoxy)octafluorobiphenyl 24.5 g of 5-hydroxy-2-nitrophenyl benzyl ether (0.1 mol) and 16.7 g of decafluorobiphenyl (0.05 mol) are dissolved in 270 ml of dry dimethyl sulfoxide in a three-neck flask fitted with reflux condenser, stirrer and nitrogen inlet. After 30 g of potassium carbonate (0,22 mol) have been added, the solution is heated at 100° C. for 4 hours in a temperature-controllable oil bath. The reaction solution is then allowed to cool to room temperature, and the residue is filtered off via a fluted filter. The solution is then added to 500 ml of water, and concentrated hydrochloric acid is added until the mixture is acidic. The yellow-beige reaction product which precipitates during this is filtered off via a Buchner funnel, washed three times with water and, then recrystallized from a mixture of methanol and methylene chloride (volume ratio 1:1). The reaction product is then dried for 48 hours under nitrogen at 40° C./10 mbar in a vacuum drying cabinet.

72 g of the 4,4'-bis(4-nitro-3-5 benzyloxyphenoxy) octafluorobiphenyl prepared in this way (0.09 mol) are dissolved in 600 ml of a mixture of tetrahydrofuran and ethyl acetate (volume ratio 1:1), and 7 g of Pd/C (palladium/carbon) are added to the solution. The mixture is then hydrogenated at room temperature in an autoclave with vigorous stirring using hydrogen at a pressure of 1 bar; after 7 days, the reaction is terminated. The yellow-beige solution is evaporated to half in a rotary evaporator and left to stand overnight at room temperature, during which the reaction product precipitates in crystalline form. The reaction product is then dried for 48 hours under nitrogen at 40° C./10 mbar in a vacuum drying cabinet.

EXAMPLE 2
Preparation of a PBO Precursor 54.4 g of 4,4'-bis{4-amino-3-hydroxyphenoxy) octafluorobiphenyl prepared as described in Example 1 (0.1 mol) are dissolved in 300 ml of distilled N-methylpyrrolidone. A solution of 29.5 g of oxybisbenzoyl chloride (0.1 mol) in 150 ml of γ-butyrolactone is added drop wise to this solution at 10° C. with stirring, and the reaction solution is stirred for 16 hours. A solution of 17.4 g of pyridine (0.22 mol) in 80 ml of γ-butyrolactone is then slowly added drop wise to the reaction solution at room temperature, and the resultant reaction solution is stirred at room temperature for 2 hours. The resultant polymer is precipitated by adding the reaction solution drop wise to a mixture of isopropanol and water (1:3), washed three times with fresh precipitant and dried for 72 hours at 50° C./10 mbar in a vacuum oven.

The PBO precursor prepared in this way is readily soluble in solvents such as N-methylpyrrolidone, γ-butyrolactone, acetone, tetrahydrofuran, cyclopentanone, diethylene glycol monoethyl ether, ethyl lactate and ethanol, and in commercially available aqueous-alkaline developers which are free from metal ions, such as NMD-W (Tokyo Ohka).

EXAMPLE 3
Determination of Moisture Absorption 4 g of the PBO precursor from Example 2 are dissolved in 12 g of distilled N-methylpyrrolidone. The solution is applied to a substrate in the form of a cleaned, dried and precisely weighed silicon wafer by means of a plastic syringe provided with a prefilter, and spun in a spin-coating apparatus (Convac ST 146). The film formed on the substrate is first predried at 120° C. on a hotplate and then—for the cyclization (on the substrate)—heated to 350° C. under nitrogen in a programmable laboratory oven ("Sirius Junior", LP-Thermtech AG) and held at this temperature for 1 hour, then cooled. The heating and cooling rates are each 5° C./min.

The coated substrate is placed in a tared microbalance (Mettler Toledo AT 261 Deltarange) with a sealed chamber containing phosphorus pentoxide as desiccant. The total weight determined after 24 hours is 11.50864 g, This gives a weight of 0.15432 g for the cyclized polymer (weight of the pure silicon wafer=11.35432 g). The phosphorous pentoxide is then replaced by a saturated sodium chloride solution, and a relative humidity (23° C.) of 76% is set in the chamber. After storage for a further 24 hours, the weight of the film increases to 0.15562 g. This gives a moisture absorption of 0.84%. An uncoated silicon wafer exhibits no moisture absorption under identical conditions.

EXAMPLE 4
Determination of the Degree of Planarization

The planarization capacity of polybenzoxazoles prepared from the precursors of the invention by cyclization on a substrate is determined on silicon wafers having aluminum structures 1.2 micron in height (planarization wafers) The degree of planarization is given for the repeating 5 micron structures (=line and space width; alternating). The degree of planarization is determined as described by D. S. Soane and Z. Martynenko: "Polymers in Microelectronics—Fundamentals and, Applications", Elsevier Science Publishers B.V., Amsterdam 1989, pages 189 to 191.

The PBO precursor of Example 2 is applied—as in Example 3—to a planarization wafer (substrate) and cyclized. The cyclized film has a thickness of 2.0 microns; the degree of planarization is 84%.

EXAMPLE 5
Heat Stability

Some of the cyclized polymer of Example 3 is removed from the substrate after the moisture measurement and analyzed thermogravimetrically (Polymer Laboratories STA 1500 instrument). This analysis shows that a weight loss of 1% is not achieved until a temperature of 480° C. By comparison, a weight loss of 1% is already achieved at a temperature of from 420 to 430° C. in known polybenzoxazoles (see SU 1 205 518 A).

EXAMPLE 6
Photostructuring 4 g of the PBO precursor of Example 2 together with 1 g of a diester of bisphenol A and diazonaphthoquinone-5-sulfonic acid (photo-active component) are dissolved in 15 g of N-methylpyrrolidone. This photo-resist solution is applied to a substrate in the form of a cleaned and dried silicon wafer by means of a plastic syringe provided with a prefilter, and is spun in spin-coating apparatus (Convac ST 146). The resist film formed on the substrate is firstly predried at 120° C. on a hotplate and then exposed through a mask in an exposure apparatus (Karl Süss 121). After development using an aqueous-alkaline developer (NMD-W, Tokyo Ohka, diluted 1:1 with water) and cyclization (on the substrate) at 350° C. as described in Example 3, high-temperature-stable resist structures having a resolution of 2 micron at a layer thickness of 1.7. micron are obtained.

EXAMPLE 7 (COMPARATIVE EXAMPLE)

A PBO precursor is prepared analogously to Example 2, using—under otherwise identical conditions—hexafluoro-2, 2-bis(3-amino-4-hydroxyphenyl)propane (0.1 mol, i.e. 36.6 g) as described in EP 0 264 678 B1 as bis-o-aminophenol. For this precursor, a moisture absorption of 1.8% (see Example 3) and a degree of planarization of 68% (see Example 4) are determined.

EXAMPLE 8 (COMPARATIVE EXAMPLE)

A PBO precursor is prepared analogously to Example 2, using—under otherwise identical conditions—3, 3'-dihydroxybenzidine (0.1 mol, i.e. 21.6 g) as described in EP 0 023 662 B1 as bis-o-aminophenol. For this precursor, a moisture absorption of 2.1% (see Example 3) and a degree of planarization of 61% (see Example 4) are determined.

EXAMPLE 9
Preparation of a PBO Precursor and Determination of its Properties

A PBO precursor is prepared analogously to Example 2, using—under otherwise identical conditions—4,4'-bis(4-amino-3-hydroxyphenoxy)octafluorobenzophenone (0.1 mol, i.e. 57.2 g) as bis-o-aminophenol. The bis-o-aminophenol is prepared—analogously to Example 1—from 5-hydroxy-2-nitrophenyl benzyl ether and decafluorobenzophenone.

The PBO precursor obtained is readily soluble in the solvents listed in Example 2. For this precursor, a moisture absorption of 0.95% (see Example 3) and a degree of planarization of 87% (see Example 4) are determined. After the photo-structuring carried out as described in Example 6 and cyclization on the substrate, high-temperature-stable resist structures having a resolution of 2 micron at a layer thickness of 1.9 micron are obtained.

EXAMPLE 10
Preparation of a PBO Precursor and Determination of its Properties A PBO precursor is prepared analogously to Example 2, using—under otherwise identical conditions—4, 6-bis(4-amino-3-hydroxy-2,5,6-trifluorophenoxy)pyrimidine (0.1 mol, i.e. 43.4 g) as bis-o-aminophenol and isophthaloyl dichloride (0.1 mol, i.e. 20.3 g) is employed as dicarboxylic acid dichloride.

The bis-o-aminophenol is prepared—analogously to Example 1—from 4,6-dihydroxypyrimidine and pentafluoronitrobenzene.

The PBO precursor obtained is readily soluble in the solvents listed in Example 2. For this precursor, a moisture absorption of 0.97% (see Example 3) and a degree of planarization of 86% (see Example 4) are determined. After the photo-structuring carried out as described in Example 6 and cyclization on the substrate, high-temperature-stable resist structures having a resolution of 2 micron at a layer thickness of 2 micron are obtained.

EXAMPLE 11
Preparation of a PBO Precursor and Determination of its Properties A PBO precursor is prepared analogously to Example 2, using—under otherwise identical conditions—2, 2-bis[4-(4-amino-3-hydroxy-2,5,6-trifluorophenoxy)phenyl] hexafluoropropane (0.1 mol, i.e. 65.8 g) as bis-o-aminophenol and perfluoroisophthaloyl dichloride (0.1 mol, i.e. 27.5 g) is employed as dicarboxylic acid dichloride. The bis-o-aminophenol is prepared—analogously to Example 1—from 6F-bisphenol A and pentafluoronitrobenzene.

The PBO precursor obtained is readily soluble in the solvents listed in Example 2. For this precursor, a moisture absorption of 0.79% (see Example 3) and a degree of planarization of 84% (see Example 4) are determined. After the photo-structuring carried out as described in Example 6 and cyclization on the substrate, high-temperature-stable resist structures having a resolution of 2 micron at a layer thickness of 1.9 micron are obtained.

EXAMPLE 12
Preparation of a PBO Precursor and Determination of its Properties A PBO precursor is prepared analogously to Example 2, using—under otherwise identical conditions —1,4-bis(4-amino-3-hydroxy-2,5,6-trifluorophenoxy) tetrafluorobenzene (0.1 mol, i.e. 50.4 g) as bis-o-aminophenol and adipic dichloride (0.1 mol, i.e.18 g) is employed as dicarboxylic acid dichloride. The bis-o-aminophenol is prepared—analogously to Example 1—from tetrafluorohydroquinone and pentafluoronitrobenzene.

The PBO precursor obtained is readily soluble in the solvents listed in Example 2. For this precursor, a moisture absorption of 0.96% (see Example 3) and a degree of planarization of 85% (see Example 4) are determined. After the photo-structuring carried out as described in Example 6 and cyclization on the substrate, high-temperature-stable resist structures having a resolution of 2 micron at a layer thickness of 2.2 micron are obtained.

EXAMPLE 13
Preparation of a PBO Precursor and Determination of its Properties The PBO precursor described in Example 2 can also be prepared by a chloride-free method. To this end, 25.8 g o oxybisbenzoic acid (0.1 mol) are dissolved in 200 ml of N-methylpyrrolidone, and 34.1 g of carbonyldiimidazole (0.21 mol) are added in portions. When the evolution of gas ($CO_2$) has subsided, the mixture is stirred for a further 2 hours. The resultant suspension is then added to 54.4 g of 4,4'-bis(4-amino-3-hydroxyphenoxy)octafluorobiphenyl (0.1 mol) dissolved in 300 ml of N-methylpyrrolidone, and the mixture is stirred at room temperature for 40 hours; during this period, the reaction solution becomes clear again. The precipitation and drying of the PBO precursor are carried out as in Example 2.

The PBO precursor obtained is readily soluble in the solvents listed in Example 2. For this precursor, a moisture absorption of 0.86% (see Example 3) and a degree of planarization of 82% (see Example 4) are determined; the heat stability is 480° C. (see Example 5). After the photo-structuring carried out as described in Example 6 and cyclization on the substrate, high-temperature-stable resist structures having a resolution of 2 micron at a layer thickness of 2.2 micron are obtained.

EXAMPLE 14
Preparation of a PBO Precursor and Determination of its Properties A PBO precursor is prepared analogously to Example 13, using—under otherwise identical conditions—4,4'-bis(4-amino-3-hydroxy-2,5,6-trifluorophenoxy) octafluorobiphenyl (0.1 mol, i.e. 65.2 g) as bis-o-aminophenol and 4,4'-bis(4-carboxyphenoxy) octafluorobiphenyl (0.1 mol, i.e. 57 g) is employed as dicarboxylic acid. The bis-o-aminophenol is prepared—analogously to Example 1—from 4,4'-octafluorobiphenol and pentafluoronitrobenzene.

The PBO precursor obtained is readily soluble in the solvents listed in Example 2. For this precursor, a moisture absorption of 0.72% (see Example 3) and a degree of planarization of 82% (see Example 4) are determined. After the photo-structuring carried out as described in Example 6 and cyclization on the substrate, high-temperature-stable resist structures having a resolution of 2 micron at a layer thickness of 1.8 micron are obtained.

EXAMPLE 15
Preparation of a PBO Precursor and Determination of its Properties A PBO precursor is prepared analogously to Example 13, using—under otherwise identical conditions—2,4-bis(4-amino-3-hydroxyphenoxy)-3,5,6-trifluoro-pyridine (0.1 mol, i.e. 37.9 g) as bis-o-aminophenol and 4,4-bis(4-carboxyphenoxy)octafluorobiphenyl (0.1 mol, i.e. 57 g) is employed as dicarboxylic acid. The bis-o-aminophenol is prepared—analogously to Example 1—from 5-hydroxy-2-nitrophenyl benzyl ether and pentafluoropyridine.

The PBO precursor obtained is readily soluble in the solvents listed in Example 2. For this precursor, a moisture absorption of 0.96% (see Example 3) and a degree of planarization of 84%(see Example 4) are determined. After the photo-structuring carried out as described in Example 6 and cyclization on the substrate, high-temperature-stable resist structures having a resolution of 2 micron at a layer thickness of 2 micron are obtained.

EXAMPLE 16
Preparation of a PBO Precursor and Determination of its Properties A PBO precursor is prepared analogously to Example 13, using—under otherwise identical conditions—2,4-bis(4-amino-3-hydroxyphenoxy)-1-trifluoromethyl-3,5,6-trifluorobenzene (0.1 mol, i.e. 44.6 g) as bis-o-aminophenol and isophthaloyl dichloride (0.1 mol, i.e. 20.3 g) is employed as dicarboxylic acid dichloride. The bis-o-aminophenol is prepared—analogously to Example 1—from 5-hydroxy-2-nitrophenyl benzyl ether and octafluorotoluene.

The PBO precursor obtained is readily soluble in the solvents listed in Example 2. For this precursor, a moisture absorption of 0.9% (see Example 3) and a degree of planarization of 83% (see Example 4) are determined. After the photo-structuring carried out as described in Example 6 and cyclization on the substrate, high-temperature-stable resist structures having a resolution of 2 micron at a layer thickness of 2 micron are obtained.

We claim:

1. A poly[bis(thio)phenolcarboxamide-(thio)ether] polybenzoxazole or polybenzothiazole precursor which has the following partial structure:

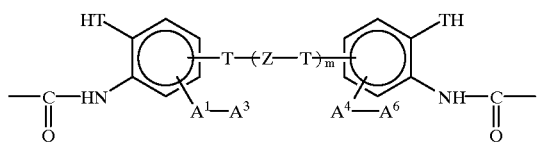

where:

$A^1$ to $A^6$ are—independently of one another—H, F, $CH_3$, $CF_3$, $OCH_3$, $OCF_3$, $CH_2CH_3$, $CF_2CF_3$, $OCH_2CH_3$ or $OCF_2CF_3$;

T is O or S, and m is 1;

Z is one of the following carbocyclic or heterocyclic aromatic radicals:

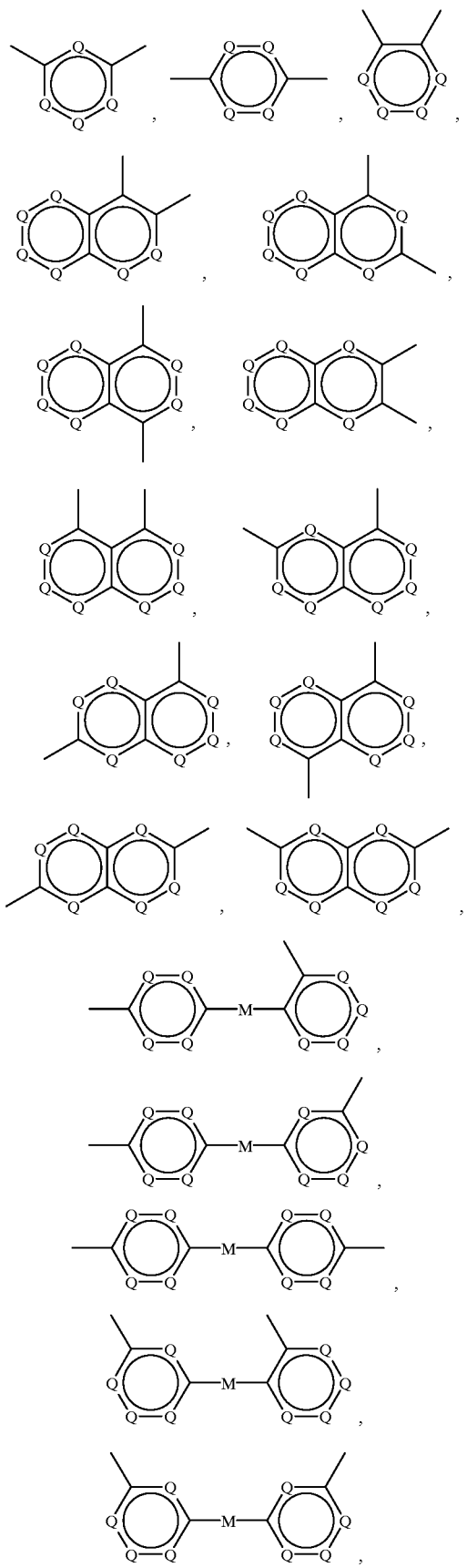

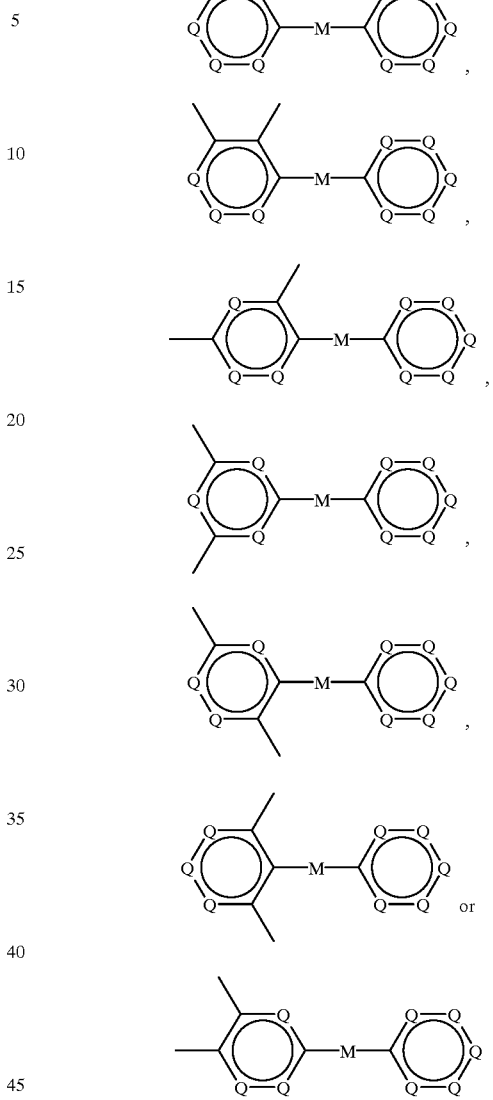

where Q=C—A or N where A=H, F, $(CH_2)_pCH_3$, $(CF_2)_pCF_3$, $O(CH_2)_pCH_3$, $O(CF_2)_pCF_3$, $CO(CH_2)_pCH_3$, $CO(CF_2)_pCF_3$ where p=0 to 8 (linear or branched chain), $OC(CH_3)_3$, $OC(CF_3)_3$, $C_6H_5$, $C_6F_5$, $OC_6H_5$, $OC_6F_5$, cyclopentyl, perfluorocyclopentyl, cyclohexyl or perfluorocyclohexyl, where, in the isolated aromatic rings, a maximum of 3 N-atoms may be present per ring and only 2 N-atoms may be adjacent, and, in the fused ring systems, a maximum of 2 N-atoms may be present per ring, M=a single bond, $(CH_2)_n$, $(CF_2)_n$, $CH(CH_3)$, $CH(CF_3)$, $CF(CH_3)$, $CF(CF_3)$, $C(CH_3)_2$, $C(CF_3)_2$, $CH(C_6H_5)$ $CH(C_6F_5)$, $CF(C_6H_5)$, $CF(C_6F_5)$ $C(CH_3)$ $(C_6H_5)$, $C(CH_3)$ $(C_6F_5)$, $C(CF_3)$ $(C_6H_5)$, $C(CF_3)$ $C(C_6H_5)$, $C(C_6F_5)_2$, $C(C_6F_5)_2CO$, $SO_2$,

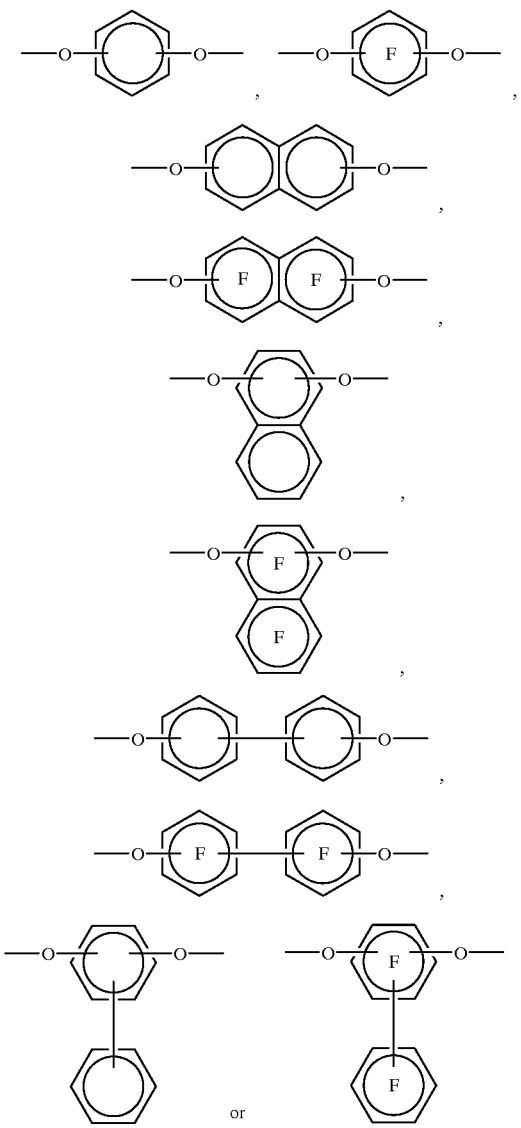

where n=1 to 8, with the proviso that, when Z=phenylene, at least one of the radicals $A^1$ to $A^6$ must be other than H, and when Z=

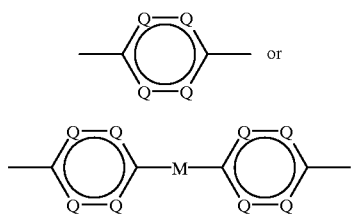

where Q is C—F and M is a single bond, the NH—CO groups of the polybenzoxazole precursor partial structure must be in the o- or p-position to the O bridge.

2. A polybenzoxazole or polybenzothiazole precursor according to claim 1 in which the partial structure is linked to the residue, having 1 to 30 carbon atoms and up to three aromatic rings, of at least one dicarboxylic acid.

3. A polybenzoxazole or polybenzothiazole precursor according to claim 2 in which the dicarboxylic acid is 4,4'-oxybis(benzoic acid), isophthalic acid, perfluoroisophthalic acid, adipic acid, azelaic acid,1,3-bis(3-carboxypropyl)tetramethyldisiloxane or 4,4'-hexafluoroisopropylidenebis(benzoic) acid.

4. A polybenzoxazole or polybenzothiazole precursor according to claim 2 in which the weight average molecular weight is in the range from 1,000 to 1,000,000.

5. A polybenzoxazole precursor according to claim 1 in which T=O.

6. A polybenzoxazole precursor according to claim 5 in which Z is

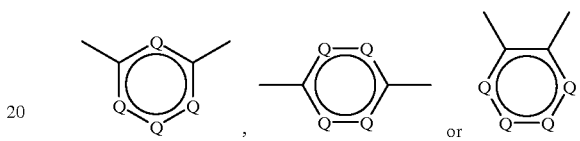

in which from zero to three Q are N not adjacent to one another and the remaining Q are C—H, C—F, or C—$CF_3$.

7. A polybenzoxazole precursor according to claim 5 in which Z is

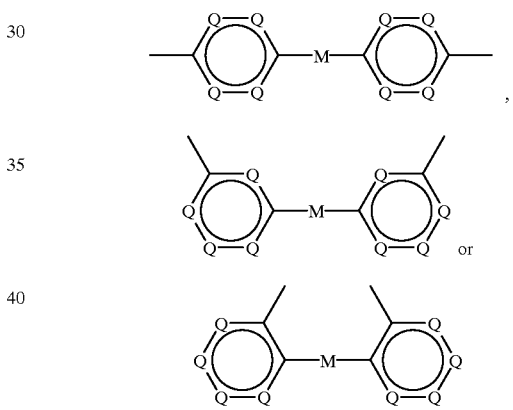

or in which Q is C—H or C—F and M is a single bond, $C(CF_3)_2$ or CO.

8. A polybenzoxazole or polybenzothiazole precursor according to claim 1 in which each Q is C—H or C—F.

9. A polybenzoxazole or polybenzothiazole precursor according to claim 1 in which all of $A^1$, $A^2$, $A^3$, $A^4$, $A^5$, and $A^6$ are the same and each is H or F.

10. A polybenzoxazole or polybenzothiazole precursor according to claim 1 in which from one to two Q are N.

11. A photo-resist solution which contains a polybenzoxazole or polybenzothiazole precursor as claimed in claim 1 and a diazoketone as photo-active component, dissolved in an organic solvent.

12. A photo-resist solution as claimed in claim 11, where the diazoketone is a diazoquinone and wherein the weight ratio between the polybenzoxazole or polybenzothiazole precursor and the diazoquinone is between 1:20 and 20:1, preferably between 1:10 and 10:1.

13. A photo resist solution as claimed in claim 11 in which the diazoketone is bisphenol A bis(diazonaphthoquinone-5-sulfonic acid ester).

14. A photo resist solution as claimed in claim 11 in which the solvent is one or more of acetone, γ-butyrolactone, cyclohexanone, diethylene glycol diethyl ether, diethylene glycol monoethyl ether, ethyl acetate, ethyl lactate, N-methylpyrrolidone, and tetrahydrofuran.

15. A moisture resistant and heat resistant resist film comprising a substrate coated with a photo resist solution as claimed in claim 11 and heat tempered.

16. A resist film as claimed in claim 15 in which the substrate is a silicon wafer.

* * * * *